United States Patent [19]

Barber

[11] Patent Number: 4,701,363
[45] Date of Patent: Oct. 20, 1987

[54] PROCESS FOR MANUFACTURING BUMPED TAPE FOR TAPE AUTOMATED BONDING AND THE PRODUCT PRODUCED THEREBY

[75] Inventor: Larry J. Barber, Sunnyvale, Calif.

[73] Assignee: Olin Corporation, New Haven, Conn.

[21] Appl. No.: 822,580

[22] Filed: Jan. 27, 1986

[51] Int. Cl.⁴ .................. B32B 3/10; B44C 1/22; C23F 1/02
[52] U.S. Cl. .................. 428/137; 29/827; 156/630; 156/634; 156/644; 156/656; 156/659.1; 156/661.1; 156/902; 357/70; 361/421; 428/156; 428/571; 428/573; 430/318
[58] Field of Search .................. 357/68, 70; 29/576 S, 29/591, 827; 174/68.5, 52 R, 52 PE, 52 FP; 428/566, 571, 573, 574, 596, 601, 137, 156, 157, 134; 361/421; 156/629, 630, 633, 634, 644, 656, 659.1, 661.1, 901, 902; 430/318

[56] References Cited

U.S. PATENT DOCUMENTS

| | | | |
|---|---|---|---|
| 3,292,241 | 12/1966 | Carroll | 29/155.5 |
| 3,440,027 | 4/1969 | Hugle | 174/68.5 X |
| 3,781,596 | 12/1973 | Galli et al. | 174/68.5 X |
| 3,832,769 | 9/1974 | Olyphant, Jr. et al. | 29/589 X |
| 3,838,984 | 10/1974 | Crane et al. | 174/52 PE |
| 3,868,724 | 2/1975 | Perrino | 357/65 |
| 3,984,620 | 10/1976 | Robillard et al. | 174/52 FP |
| 4,209,355 | 6/1980 | Burns | 156/630 |
| 4,210,926 | 7/1980 | Hacke | 357/70 |
| 4,259,436 | 3/1981 | Tabuchi et al. | 430/314 |
| 4,308,339 | 12/1981 | Lindberg | 430/312 |
| 4,312,117 | 1/1982 | Robillard et al. | 29/589 |
| 4,396,457 | 8/1983 | Bakermans | 156/634 |
| 4,411,719 | 10/1983 | Lindberg | 156/64 |
| 4,494,688 | 1/1985 | Hatada et al. | 228/180 |
| 4,510,017 | 4/1985 | Barber | 156/651 |

FOREIGN PATENT DOCUMENTS

| | | |
|---|---|---|
| 55-26613 | 2/1980 | Japan . |
| 55-26612 | 2/1980 | Japan . |
| 57-204157 | 12/1982 | Japan . |
| 57-204158 | 12/1982 | Japan . |

OTHER PUBLICATIONS

Edwards, Precision Artwork by Contact Printing and Masking, IBM Technical Disclosure Bulletin, vol. 25, No. 4, Sep. 1982, pp. 1950–1951.

"TAB Technology Tackles High Density Interconnections", by Tom Dixon, Dec. 1984, Volume of Electronic Packaging & Production, pp. 34–39.

Tape Automated Bonding and Its Impact on the PWB, presented at the 6th Annual Northern Symposium on Circuit Technology held in Edinburgh in Nov. 1983, authored by D. J. Small, Circle World, vol. 10, No. 3, 1984, pp. 26–29.

Primary Examiner—William A. Powell
Attorney, Agent, or Firm—Paul Weinstein

[57] ABSTRACT

A process for step etching a metal tape adapted for use in tape automated bonding comprises forming an etch resist pattern on the tape having a first portion defining a pattern of leads and a second portion within the first portion defining steps in the leads. The metal tape is etched in the regions not covered by the resist at a desired rate and etched in the regions for forming the step at a reduced rate as compared to the desired rate, thereby forming the tape having a plurality of leads corresponding to the resist pattern with each of the leads having a step therein generated by the second portion of the resist pattern. The metal tape formed by the process has a unique structure wherein the web between bumps formed at the end of the leads and the remainder of the leads has a unique channel beam cross section for stiffening the web which is relatively thin as compared to the leads or the bump.

18 Claims, 12 Drawing Figures

PROCESS FOR MANUFACTURING BUMPED TAPE FOR TAPE AUTOMATED BONDING AND THE PRODUCT PRODUCED THEREBY

This invention relates to a process for manufacturing bumped tape or use in tape automated bonding (hereinafter referred to as TAB). A general review of TAB technology is set forth in an article entitled "TAB Technology Tackles High Density Interconnections" by Tom Dixon, which appeared in the December, 1984, volume of *Electronic Packaging & Production* at pages 34–39. TAB technology comprises an interconnect technology used to interconnect a semiconductor device to a leadframe, semiconductor package contacts or printed circuit board. In most cases, TAB is used instead of conventional wire bonding technology. TAB is finding increased use commercially because of the trend toward increased circuit density. TAB permits closer spacing of interconnect bonding pads on the semiconductor die than would be achievable by wire bonding. One of the significant advantages of TAB is that certain TAB constructions permit device testing and burn in prior to mounting in a package or on a substrate. This permits culling of bad devices prior to their incorporation into expensive circuits and packages.

There are three general forms of TAB construction. The first is a single layer or all metal construction; the second is a two layer construction comprising a metal layer with a dielectric backing such as a polyimide; and the third is a three layer construction comprising a metal layer adhesively bonded to a dielectric such as KAPTON polyimide. Further details concerning these respective constructions can be obtained from a review of the aforenoted Dixon article.

A TAB interconnect generally comprises a plurality of narrow leads arranged to extend outwardly from a semiconductor die such that the inner lead portions are adapted to be bonded to the semiconductor die contact pads and the outer lead portions are adapted to bond to a leadframe, circuit board, etc., as desired. In the single layer version, a metal frame supports the elongated leads; whereas, in the two or three layer versions, a polyimide substrate supports the leads.

The TAB process involves first bonding the inner lead portions of the TAB tape to the semiconductor device followed by excising the leads from the tape frame or support substrate and then bonding the outer lead portions to the desired leadframe, package circuitry or printed circuitry, as desired. The TAB leads are formed from a metal foil such as copper foil and are relatively thin, namely one to four mils thick. The thinness of the TAB foil permits the interconnects to be placed more closely together thereby allowing high density interconnection at the semiconductor chip.

TAB tapes may be bumped or unbumped. The bumps act in part as mechanical standoffs from the chip. Unbumped tapes require that the semiconductor chips be bumped in order to make the desired thermocompression bond between the inner lead portion of the TAB leads and the chip. Bumped tapes eliminate the need for bumping of the wafer and, therefore, permit the TAB interlead bond portions to be bonded directly to ordinary semiconductor die bonding pads. The bumped tape normally has a copper projection or bump positioned at the point where it is to be joined to the die. This bump may, if desired, be covered with a suitable plating such as gold, tin or nickel.

Currently, bumped TAB tapes are commercially available in the single layer variety. A disadvantage of the single layer bumped tape is that it is not testable since all of the leads after bonding to the semiconductor die are still electrically interconnected by the metal frame of the tape. Since one of the desirable advantages of TAB technology is the ability to pretest and burn in, there has been a significant amount of development relating to bumped tape and testable bumped tape in particular. This developmental activity is best illustrated by a consideration of the following patents.

The formation of single layer bumped tape is amply illustrated in U.S. Pat. Nos. 4,210,926 to Hacke; 4,308,339 and 4,411,719 to Lindberg and Japanese Patent Publication 55-26613. The formation of single layer bumped tape normally involves coating the metal foil or tape with a photoresist on both sides and forming photoresist images on both sides of the tape. On one side of the tape, the developed photoresist pattern overlies the interconnect fingers and the tape frame leaving bare the areas between the fingers. On the other side of the tape, the developed photoresist pattern overlies the bumps. The resultant structure is then etched. Those portions of the foil which are subjected to etching from both sides etch all the way through. Those portions of the foil, such as the leads which are subjected to etching from only one side, etch partially the way through thereby leaving the desired step defining an integral bump at the free end of the leads comprising the inner lead bonding portions. While the aforenoted process forms a bumped tape with a single etching step. It is difficult to carry out because of the critical alignment that is required between the resist pattern for the bumps on one side of the tape and the lead pattern which appears on the other side of the tape. This is normally accomplished by simultaneous exposure of the photoresist in a highly complex camera arrangement, which permits the two images to be registered. In any event, the resultant tape is non-testable because the metal frame supporting the leads short circuits them.

In order to overcome this deficiency and form a testable bumped tape, in U.S. Pat. No. 4,209,355 to Burns it is suggested to take a metal tape formed by the aforenoted process and adhesively bond it to a polyimide substrate film to form a three layer tape structure. After the bumped tape is adhered to the substrate, the frame supporting the bumped tape fingers is cut by etching to separate, in an electrical sense, each of the leads from one another. This process has some major deficiencies. The bumped metal tape must be handled in order to adhere it to the polyimide substrate. The leads of the bumped tape, because of their small size and narrow spacing, are extremely susceptible to being damaged during such handling. Further, even after bumped metal tape is adhered to the substrate, it is necessary to undertake a further etching cycle in order to electrically separate the respective leads.

Another approach to forming a testable bumped tape is illustrated in Japanese Patent Publication No. 55-26612. In this approach, a three layer tape is subjected to processing similar to that described by reference to the one layer tape and the bumped tape is formed in a single etching step. In order to form the tape of this publication, it is necessary to image the photoresist to form the lead pattern on the outer surface of the foil and to image the photoresist to form the bump pattern inside the perforation in the polyimide substrate. Aligning the bumps and the finger pattern is extremely difficult with the metal foil alone wherein the imaging is carried out on two planar surfaces. Forming the image of the bumps within a hole in the polyimide should be extremely difficult to carry out with the level of precision and registration required. While the approach is shown for a relatively simple TAB tape, it is not seen how it can be readily applied to high density TAB tapes where achieving the requisite registration precision is most difficult.

Yet another approach to making testable bumped tape involves using two or three layer tape with two photoresist imaging steps and etching steps. In these embodiments, the leads on the polyimide substrate are formed by a first photoresist imaging and etching sequence and the bumps are then formed in a second photoresist and etching sequence. The bumps extend upwardly from the polyimide substrate. This approach is illustrated in U.S. Pat. No. 3,440,027 to Hugle, Japanese Patent Publication Nos. 57-204157 and 57-204158 to Takahashi as well as in the a paper presented at the 6th Annual Northern Symposium on Circuit Technology held in Edinburgh in Nov. 1983, authored by D. J. Small and entitled "Tape Automated Bonding and its Impact on the PWB". While the approaches of these patents and publications overcome the difficulty of imaging through the aperture in the polyimide substrate which would be encountered in Japanese Patent Publication No. 55-26612 they do so at a penalty in manufacturing process complexity. Rather than one etching cycle, as in Japanese Patent Publication No. 55-26612, they require two etching cycles. Further, even these approaches do not overcome the registration problems previously identified since two separate photoresist exposures, one each for the leads and the bumps, are required. While both of these exposures may be made from the same side, thereby eliminating the difficulties associated with two sided exposure, they still must be made with exceptional accuracy to provide proper registration of the bumps on the tips of the leads. This is very difficult to do in an automated manner due to the tolerance buildup encountered in forming the repetitive patterns on the tape substrate.

Yet another approach to manufacturing testable bump tape is set forth in U.S. Pat. No. 4,510,017 to Barber. The process of this patent, while yielding a tape having the desired characteristics, is quite complex and involves a series of electroplating, deposition and selective etching steps.

No discussion of bumped tape is complete without reviewing the other alternatives to forming bumped tape as set forth in the patented art. In U.S. Pat. Nos. 3,832,769 to Olyphant, Jr. et al.; 3,838,984 to Crane et al.; and 3,868,724 to Perrino, bumped tapes are illustrated wherein the bumps are formed through holes or vias in the polyimide substrate. In U.S. Pat. Nos. 3,292,241 to Carroll; 3,781,596 to Galli et al.; and 4,259,436 to Tabuchi et al, there are disclosed bumped tapes wherein the bumps on the inner lead ends of the lead are formed by coating or plating. U.S. Pat. No. 4,494,688 to Hitada et al. describes yet another bumped tape arrangement wherein the bumps are attached or bonded to the lead ends. In U.S. Pat. No. 4,396,457 to the bumps in the inner lead portions of the leads are formed by punching. In U.S. Pat. Nos. 3,984,620 and 4,312,117 to Robillard et al., the bumps and leads are formed on a substrate by vapor deposition.

The aforenoted problems and difficulties can be readily overcome in accordance with this invention through the use of a relatively simple approach which permits the bumps and the lead patterns in the TAB tape to be formed simultaneously in a single etching step preceded by a single exposure of a photoresist coating on one side of the tape. The process can be applied to form single layer bumped tape, however, it is preferred to form multi-layer bumped tape which will permit pre-testing and burn in. The simultaneous etch forming of the lead pattern in the tape and the bumps is accomplished by uniquely configuring the etch resist pattern defining the leads. In particular, each lead in the pattern of etch resist is made up of a first portion which is adapted to resist etching and a second portion within the first portion of the lead pattern wherein the resist includes one or more openings which permit etching of the metal tape underlying the resist at a rate reduced as compared to the etching of the metal tape not covered by the resist at all. This reduced etching rate is achieved by restricting the size of the openings. The resist pattern in the second portion is also configured so that there are sufficient openings so that upon completion of the etching of the tape to form the lead pattern the etching in the second portion, undercuts the resist completely to form a step or channel in the lead. By positioning the step adjacent to the inner lead bond portion of the lead a bump is defined. Obviously, the process can be applied to form bumps both on the inner lead bond portion of the leads and the outer lead bond portion of the lead, if desired.

The process in accordance with this invention yields a bumped TAB tape having a very unique lead structure. In particular, the step which is etched in the leads to define the bumps comprises a web extending from the bump to the unetched lead having a channel beam like cross section. This channel beam cross section provides improved stiffness to the web which is otherwise relatively thinner in thickness than the remaining portion of the lead and the bumps.

Accordingly, in accordance with this invention, a process is provided for step etching a metal tape preferably adapted for use in tape automated bonding. The process comprises providing such a metal tape and forming an etch resist layer at least over a first and an opposing face of the metal tape. The etch resist layer can comprise a photoresist, as are commonly employed in the art. A pattern of interconnect leads is formed in the resist layer over the first face of the metal tape wherein the resist pattern defines the leads. This can be accomplished by conventional photoetch techniques. The forming step includes forming a first portion of the resist pattern to define the leads, with the first portion of the resist pattern being adapted to substantially resist etching of the underlying metal tape from the first face and forming a second portion of the pattern, within the first portion of such pattern, wherein the second portion is configured to allow etching of the underlying metal tape from the first face at a reduced rate as compared to portions of the metal tape not covered by the resist pattern. Thereafter, the metal tape is etched in the regions not covered by the resist pattern at a desired rate and etched at the portion underlying the second portion of the resist pattern at a reduced rate as compared to the desired rate so as to form a metal tape having a pattern of interconnect leads corresponding to the resist pattern with the leads having a step therewithin adjacent to the second portion of the resist pattern. In accordance with this invention, it is possible to form the leads and the steps therein simultaneously.

Preferably in accordance with this invention, the steps in the leads are utilized to provide bumps at the inner lead bonding portions of the leads. This is accomplished by positioning the second portion of the lead resist pattern adjacent to the inner lead portion end of the lead.

Preferably, the step comprises a web extending between the unetched portion of the lead and the bump. Preferably, the web has a channel beam type cross section which acts to stiffen the web, which is reduced in thickness as compared to the unetched portions of the lead.

If a single layer tape is desired, then it is also preferred to provide as part of the resist pattern, a frame portion which after etching results in a metal frame corresponding to the frame portion adapted to support the leads.

However, as previously noted, the most preferred embodiment in accordance with this invention involves the provision of a two or three layer TAB tape having bumps at least at the inner lead portions, although the bumps may be at both the inner lead and outer lead portions. Such a tape would be testable and could be burned in. This is accomplished by starting with a two or three layer tape, instead of with an all metal tape. The metal tape has its second face bonded to a flexible nonmetallic substrate either directly or through the use of adhesive. When utilizing the process of this invention for making two or three layer tape, the etch resist layer is formed at least over the first face of the metal tape and over the second face of the metal tape located within any aperatures in the flexible substrate. The flexible nonmetallic substrate serves as an etch resist for the second face of the tape and, therefore, it need not be covered with etch resist, although for manufacturing simplicity, if desired, it can also be covered.

Obviously, the lead patterns can be formed in a repetitive manner in either the single layer or the multi-layer tapes, as described above. Further, the tapes can include a plurality of sprocket holes arranged along the longitudinal edges thereof for purposes of mechanical handling the registration during processing and assembly.

It is an aim of the present invention to provide a process for manufacturing bumped single or multi-layer TAB tape which avoids the problems and difficulties encountered by the prior art approaches.

It is a further aim of this invention to provide a process and an improved product produced thereby which provides a high degree of accuracy in locating bumps at the bond portions of the tape.

It is yet a further aim of this invention to provide a process as above which is simple to carry out requiring but a single photoresist exposure step and a single etching step.

These and other aims will become more apparent from the following description and drawings in which like elements have been given like reference numbers and in which primed or multiprimed numbers comprise similar elements providing similar functions.

Figure 1:
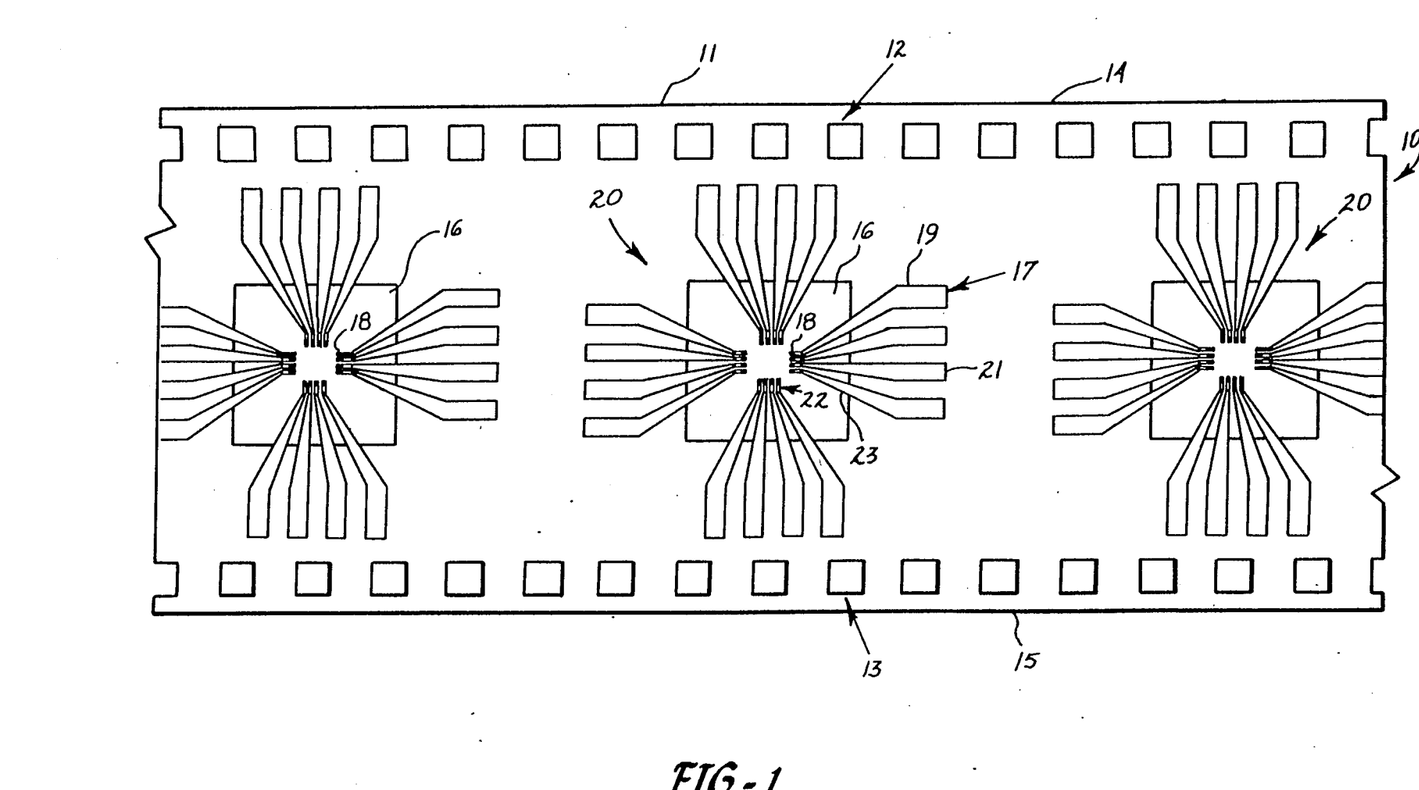
FIG. 1 is a top view of a testable TAB tape formed in accordance with the present invention.

Referring now to FIG. 1, there is shown by way of example a testable multi-layer bumped TAB tape 10 formed by the process in accordance with this invention. The tape 10 could be a two layer tape wherein a metal foil layer is directly adhered to a nonmetallic flexible substrate or a three layer tape wherein the foil is adhered to the substrate by means of an adhesive. In the embodiment of this invention, which will be illustrated, a three layer tape will be described.

The tape 10 is comprised of a nonmetallic flexible substrate 11 which is preferably formed of a polyimide, such as KAPTON. The substrate 11 includes two rows of sprocket holes 12 and 13 extending longitudinally adjacent opposing longitudinal edges 14 and 15 of the substrate 11. The use of such sprocket holes in TAB type tapes is conventional and permits operations on the tape to be properly registered by reference to the sprocket holes. The substrate 11 also includes a plurality of apertures 16 generally centrally located between the edges 14 and 15 and spaced apart longitudinally along the length of the tape.

A plurality of metal foil leads 17, normally copper foil although they could be other metals as desired, are supported by the substrate 11. The leads 17 are arranged on the substrate 11 so that the inner lead portions 18 extend in cantilever fashion into the aperture 16. The apertures 16 shown are square in shape, however, they may have any desired shape. The leads 17 are normally arranged about the entire aperture 16 periphery in order to obtain the high lead counts required. The lead count is the total number of leads extending into the aperture 16. The inner lead bond portions 18 are at one end of the lead 17. The opposing end portions 19 are attached to the substrate 11. The leads 17 surrounding a given aperture 16 comprise a pattern of interconnect leads 20.

As shown in FIG. 1, a TAB tape is usually prepared with a plurality of spaced apart interconnect patterns 20 arranged serially or longitudinally along the length of the tape. Each pattern 20 of interconnect leads is adapted to connect a semiconductor device to a leadframe or other type of semiconductor package electrical connection system or in some cases, the foil leads 17 can extend outwardly of the package and connect directly to a circuit such as a printed circuit board. In accordance with TAB technology, the lead count can vary, as desired, for a particular application. For example, as few leads as sixteen can be arranged, four on each side of the aperture 16, as shown or as many as several hundred can be employed. It is a feature of TAB technology that the thinness of the foil lead 17 permits them to be closely spaced together and to be relatively narrow in stature.

Figure 2:
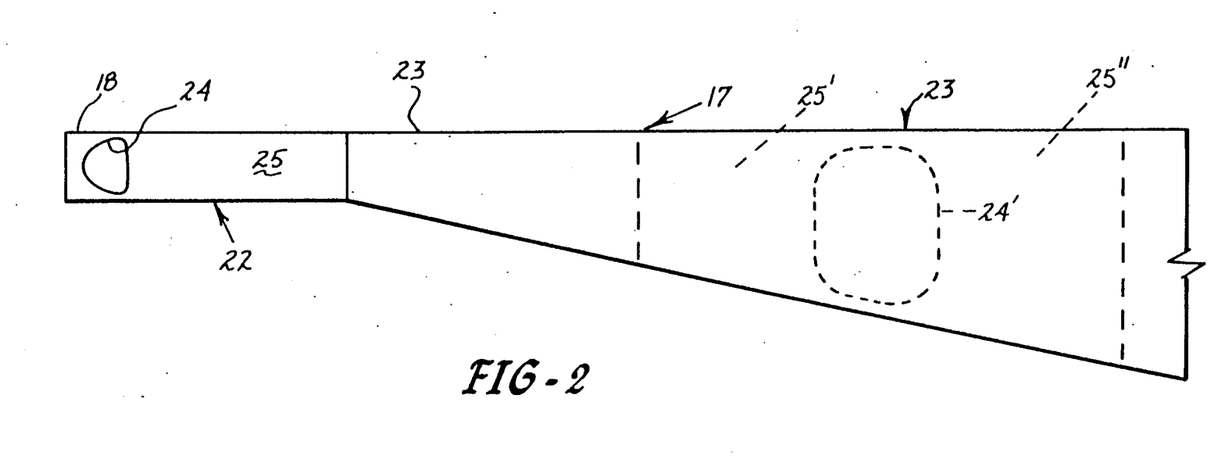
FIG. 2 is an enlarged top view of a portion of a lead in the tape of FIG. 1.
Figure 3:
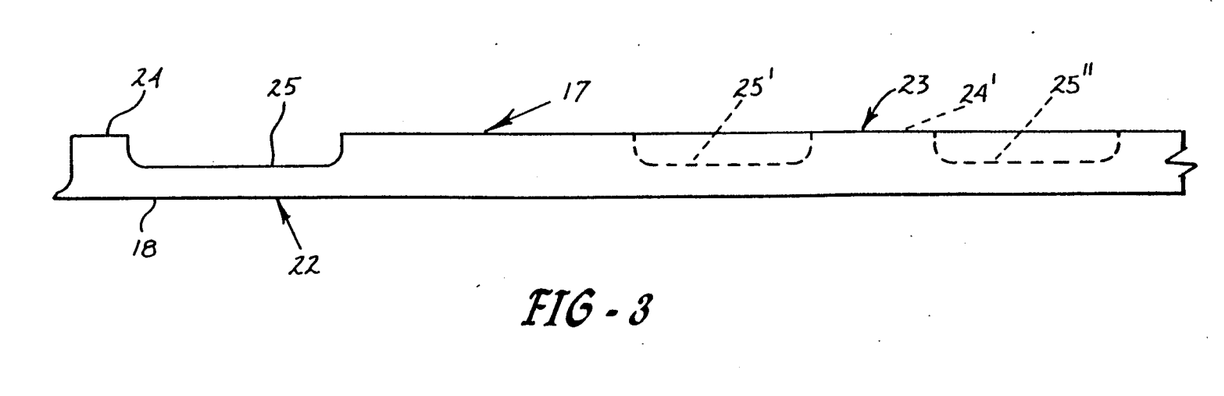
FIG. 3 is a side view of the lead portion of FIG. 2.

Referring now to FIGS. 1 through 3, further details of the leads 17 will be described. The portion of the leads shown in FIGS. 2 and 3 comprise a portion of the lead 21 in FIG. 1, which extends within the aperture 16. The outer portion 19 of the lead 21 is relatively wide and is adapted for connection to a test or burn in rig after the inner lead bond portions 18 have been connected to a semiconductor element. As shown in FIGS. 2 and 3, as the lead extends into the aperture 16 in cantilever fashion, it narrows down to an interconnect portion 22. The interconnect portion 22 is comprised of the inner lead bond portion 18 at one end and the outer lead bond portion 23 at the opposing end of the interconnect portion 22. The inner lead bond portion 18 includes a bump 24 which is defined by a step or depression 25 extending from the bump 24. The step or depression 25 could extend for any desired length from the bump 24 along the length of the lead 17.

The outer lead bond portion 23 can also contain a bump 24', as shown in phantom. The bump 24' can comprise a single bump as in FIGS. 2 and 3 or it could be made up of a plurality of smaller bumps, as desired. The bump 24' is formed in a manner similar to that described with reference to the inner lead bumps 24. In order to define the bump 24', it is necessary to etch two steps or depressions 25' and 25", as shown in phantom, utilizing suitably configured second portions 34 in the resist pattern 31 defining the leads 17, as will be described in greater detail hereinafter. The provision of outer lead bond bumps 24' is clearly optional in accordance with this invention, however, the process of this invention is adapted to form such bumps 24', if desired.

The structure which has been defined thus far can be fabricated by a number of the prior art techniques as illustrated by reference to the patents and publications described hereinbefore. In accordance with this invention, however, the structure is obtained by a unique process which is simple, economical and avoids significant problems in prior art techniques with respect to obtaining proper registration of the bumps 24 or 24' on the leads 17.

Figure 4:
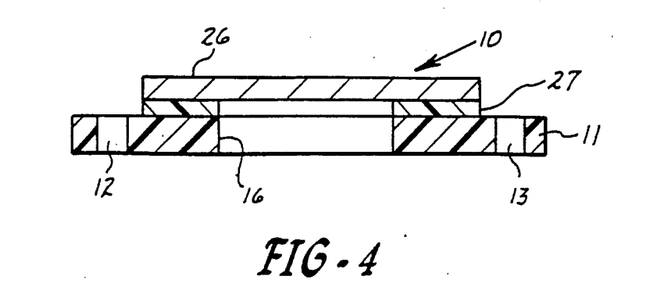
FIG. 4 is a cross-sectional view of a three layer TAB tape at the start of the process in accordance with this invention.

Referring to FIG. 4, a cross section of a typical three layer TAB tape 10 is shown before formation of the lead pattern 20. This is the starting material in accordance with one embodiment of the process of this invention. Alternatively, the starting material could comprise a two layer tape or a single layer tape, as previously described. The three layer tape is comprised of a metal foil layer 26. The foil is typically a copper foil but could comprise any other desired metals, such as aluminum. An adhesive layer 27 adheres or bonds the foil 26 to the flexible substrate 11, as previously described. The cross section in FIG. 4 has been taken through an aperture 16 and it is apparent that the foil layer 26 is exposed within the aperture 16 which extends through the adhesive layer 27. The adhesive layer 27 extends to the width of the foil layer 26 and both are narrower than the substrate 11 so that they extend between the rows 12 and 13 of sprocket holes.

Figure 5:
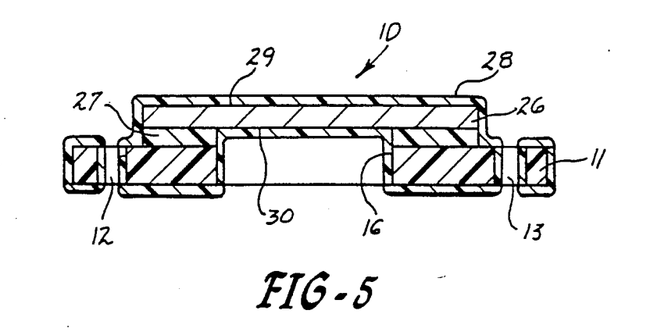
FIG. 5 is a cross-sectional view of the tape of FIG. 4 after coating with a suitable etch resist.

Referring to FIG. 5, the TAB tape 10 is coated with a suitable photoresist material 28 such as AZ1195 photoresist sold by Shipley Co. of Newton, Mass. While a photoresist is a preferred etch resist in accordance with this invention, any desired etch resist could be employed, as well as, any desired method for patterning the etch resist. The use of photoetching techniques are well-known in the art and comprise a simple and accurate approach for patterning the photoresist 28 and foil layer 26. The photoresist layer 28 may be applied to the tape 10 by any desired technique including coating as by spraying immersion, etc. or laminating as well as other techniques as are known in the art. The photoresist layer 28 coats a first face 29 and a second face 30 of the foil layer 26. The photoresist preferably consists of a light sensitive resin which is photo-degradable. A patterned mask (not shown) defining the interconnect lead pattern 20 is placed over the photoresist layer 28 which overlies the first face 29 of the foil 26. On light exposure, only the unmasked portions of the photoresist layer get exposed. In accordance with the present invention, the mask is configured to provide a unique photoresist pattern 31, which will be described in greater detail hereafter. The mask is then removed and the resist is developed.

The pattern in the mask (not shown) and the resist pattern 31 generally correspond. Therefore, the invention will be described by reference to the configuration of the resist pattern 31 which is desired. A suitable mask for forming such a resist pattern 31 can be fabricated by conventional and well-known techniques.

Figure 6:
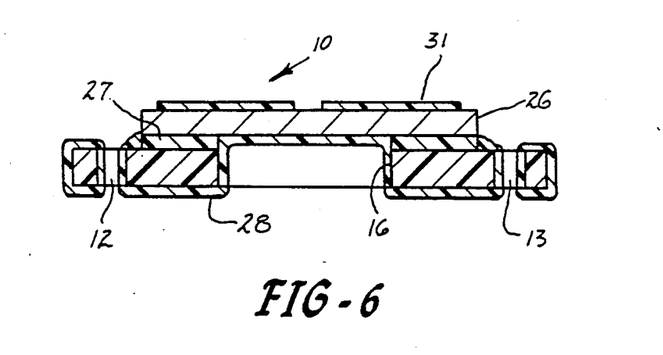
FIG. 6 is a cross-sectional view of the tape of FIG. 5 after formation of the desired etch resist pattern.

Depending on whether a positive or a negative photoresist is employed, the exposed or the unexposed portions of the photoresist layer 28 are removed as in FIG. 6 by conventional techniques such as immersion in a bath of AZ303 developer available from Shipley Co., Newton, Mass. This leaves a resist pattern 31 which defines the interconnect leads 17.

The photoresist pattern 31 is best illustrated by reference to FIG. 10 which shows the photoresist lead pattern for two interconnect lead portions 22 of two adjacent leads 17. In forming the photoresist pattern 31, a first portion 32 of the resist pattern 31 defines the leads 17. The first portion 32 of the resist pattern 31 is adapted to substantially resist etching of the underlying metal tape from the first face other than minor undercutting, which would be expected about the periphery 33 of the photoresist pattern 31. A second portion 34 of the photoresist pattern 31 for each lead 17 is arranged within the first portion 32 and is configured to allow etching of the underlying metal tape or foil layer 26 at a reduced rate as compared to portions 35 of the metal tape or foil layer 26 not covered by the resist pattern 31 or the second portion thereof 34.

Figure 7:
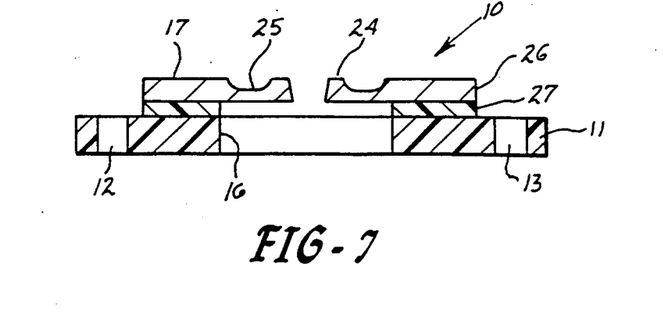
FIG. 7 is a cross-sectional view of the tape of FIG. 6 after etching and removal of the etch resist.

Thereafter, the tape 10 is subjected to etching in a convention etchant, such as ammonical cuprick chloride such as Accuguard etchant available from Philip A. Hunt Chemical Corp. of West Paterson, N.J., although any desired etchant could be employed. During the etching step, the metal tape or foil layer 26 is etched in the regions not covered by the photoresist pattern 31 at a desired rate and etched in the second portions 34 of the photoresist pattern 31 at a reduced rate as compared to the desired rate so as to form a metal tape having a plurality of interconnect leads 17 corresponding to the resist pattern 31 with the leads having a step 25 therein generated by the second portion 34 of the resist pattern, as shown in FIG. 7.

In accordance with this invention, it is possible to form the leads 17 and the steps 25 therein simultaneously with a single exposure cycle for the photoresist coating 28 and a single etching step. Since registration of the bumps 24, which result from the formation of the steps 25, is accomplished by configuring the photoresist pattern, as in FIG. 8, the registration problems of the prior art approaches are eliminated since the art work in the mask defining the photoresist lead pattern 31 defines simultaneously the lead pattern 32 and the bump forming pattern 34.

Figure 8:
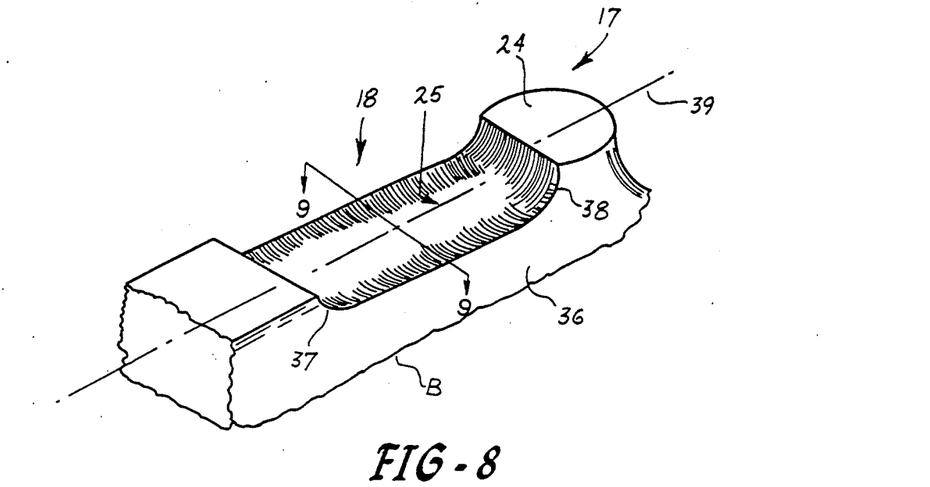
FIG. 8 is a partial perspective view of a bumped lead produced by the process of this invention.
Figure 9:
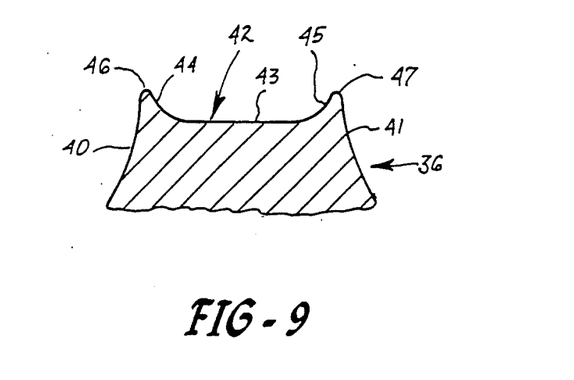
FIG. 9 is a cross-sectional view of the web portion of the step etched in the lead taken in the direction 9—9 of FIG. 8.

Referring now to FIGS. 8 and 9, the unique bumped lead 17 structure which results from the aforenoted processing will be described in greater detail. For the sake of brevity, only an inner lead bond portion 18 is shown in FIG. 8. However, the structure which will be described is equally applicable to the steps 25' and 25" which are formed in the outer lead bond portion 23 to define the bump 24'. The step 25 comprises a U-shaped configuration defined by web portion 36 having legs 37 and 38 extending outwardly from the web 36 in the same direction. The web portion or section 36 is significantly thinner than the bump 24. In order to increase the stiffness of the web section 36, the etching process of this invention provides a unique channel beam configuration for the web cross section, as shown in FIG. 9. It is apparent from a consideration of FIG. 9 that the web portion 36 also has a U-shaped or channel beam cross section transverse to the longitudinal axis 39 of the lead 17. The sides 40 and 41 of the web section 36 are inclined toward one another or inwardly of the web section 36. Between the sides 40 and 41 is a U-shaped web portion 42 defined by a central web 43 having legs 44 and 45 extending outwardly from the web 43 in the same direction until they meet the sides 40 and 41 at their free ends 46 and 47. The bottom B of the lead 17 is relatively rough because it has received an electrolytic treatment to make the copper layer 26 adhere better to the flexible substrate 11.

The channel beam cross section, as illustrated in FIG. 9, for the web 36 provides improved stiffness for the thinned web, which is important since it is intended that the bump 24 act as a standoff from the semiconductor chip to which it is bonded. If the web section 36 were not sufficiently stiff, it might sag and short out.

Referring again to FIG. 10, further details concerning the photoresist pattern 31 in accordance with this invention will now be described. The photoresist pattern 32 corresponds to the art work of the mask, which is used to expose the photoresist layer 28. In essence, the mask is like a negative and the photoresist pattern 31 is the print obtained from that negative. Accordingly, no attempt will be made herein to describe the mask per se since it is well-known in the art how to configure a mask corresponding to the photoresist pattern 31, as shown.

Figure 10:
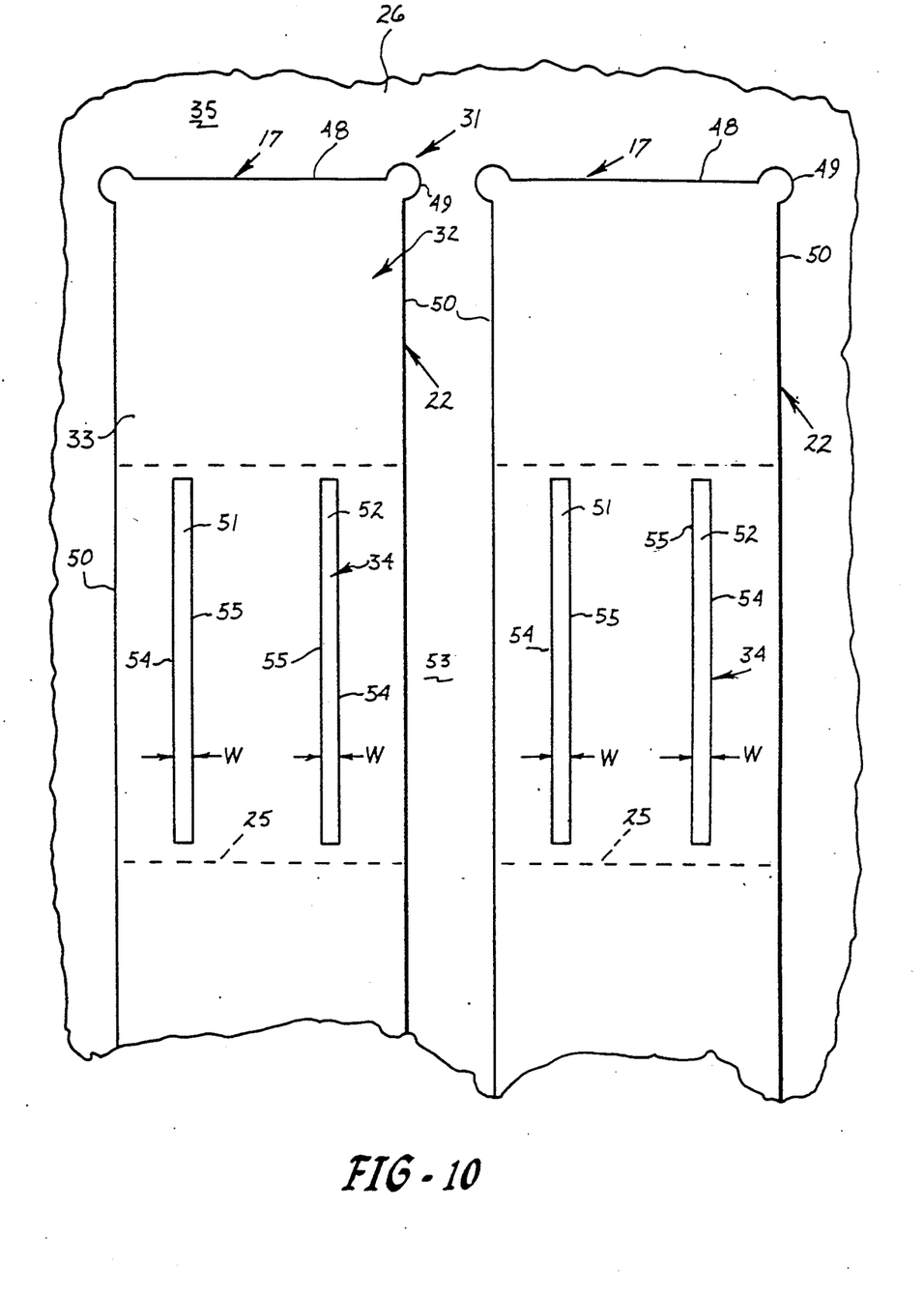
FIG. 10 is a partial top view of an etch resist pattern for forming the leads in accordance with one embodiment of this invention.

Comparing FIG. 8 and FIG. 10 it is apparent that the photoresist pattern 32 does not necessarily correspond exactly to the lead shape, which will be obtained after etching. This is the case since there is always some undercutting of the photoresist pattern which accounts for the inclined sides 40 and 41 of the web section 36 and the rounded shape of the bump 24.

The first portion of the photoresist pattern 32 at the ends 48 include rounded tabs 49 at each corner defined by a respective end 48 and side 50 of the lead pattern 32. The purpose of the tabs 49 are to reduce the undercutting at the tip of the lead in order to reduce the degree to which the tip of the lead is rounded off, as shown in FIG. 8. The second portion 34 of the lead pattern 31 in the embodiment of FIG. 10 is comprised of two generally parallel longitudinally elongated slots 51 or 52. The longitudinal length of the slots 51 and 52 determines the longitudinal or axial 39 length of the step 25 shown schematically in phantom. The width W of each slot 51 and 52 is selected so that the rate of attack of the etchant through the opening defined by the slot 51 or 52 is reduced as compared to the rate of attack of the etchant on bare portions of the copper layer 26 as, for example, the portion 53 between the respective first portions 32 of the lead pattern 31 shown in FIG. 10.

The second portion 34 of the lead pattern 31 in the embodiment of FIG. 10 is comprised of the two openings defined by slots 51 and 52. It has been found that a second portion 34 in accordance with the embodiment of FIG. 10 should most preferably have the following arrangement. For a first portion 32 of the resist pattern 31, having an approximate width of 4 mils (0.0004"), the width W should be about 0.4 mils. The distance from the side 50 of the lead pattern 32 to the outer side 54 of the slots 51 and 52 should be approximately twice the width of the slots 51 and 52 or in this example 0.8 mils. The distance between the slots 51 and 52 defined by the distance from the inner side 55 of the slot 51 to the inner side 55 of the slot 52 should be approximately 4 times the width W or in this example 1.6 mils. The length of the slots 51 and 52 may be selected as desired to form any desired length for the step 25. This example is intended by way of illustration only. The second portion 34 of the pattern 31 may have a configuration as described by reference to FIG. 10 or it may have any other desired configuration which will provide a step 25 in the lead 17 by the process of this invention. The exact shape, size and spacing of the openings defining pattern portion 34 can be determined for any desired etchant and metal layer 26 with a minimum amount of experimentation. The example which has been given is effective when utilizing the etch resist formulation and etchant discussed in detail hereinbefore.

Figure 11:
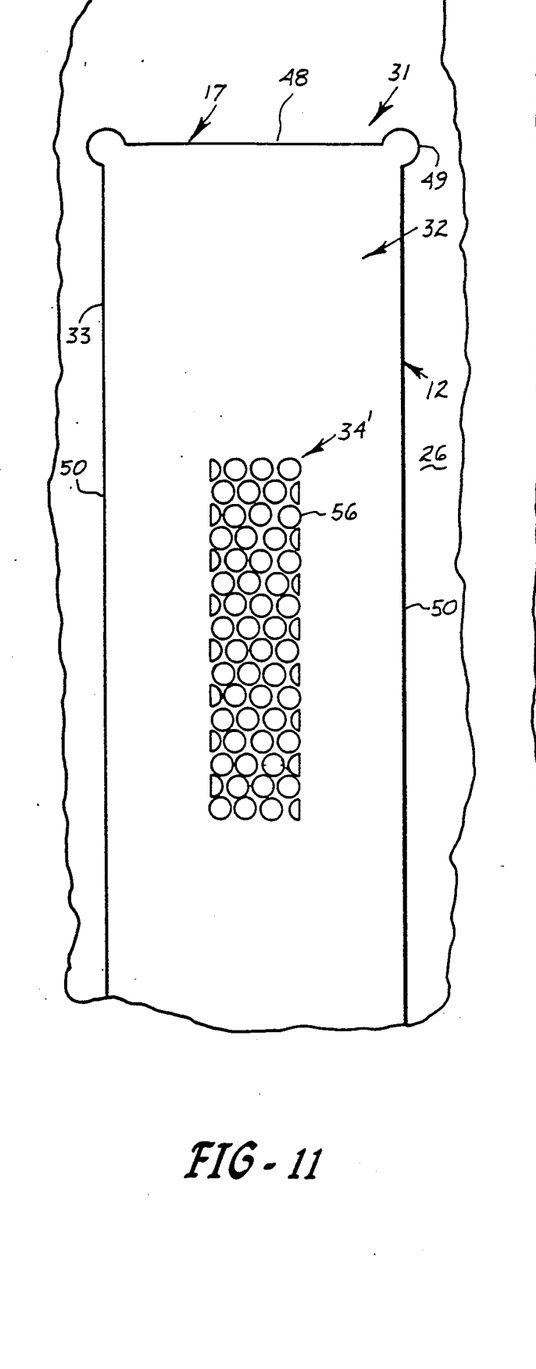
FIG. 11 is a partial top view of an etch resist pattern for forming the leads in accordance with an alternative embodiment of this invention.

The use of parallel slots to define the second portion 34 of the lead pattern 31 in the etch resist is the most preferred approach in accordance with the present invention. However, it is believed that other approaches could be utilized as, for example, those illustrated by reference to FIGS. 11 and 12. In FIG. 11, a waffle like pattern 34' comprises a series of holes 56 arranged in staggered rows. The size of the holes and the distance between the holes would be selected to provide a reduced etching rate for the pattern 34' as compared to the bare metal 26. If it is desired to etch through approximately half of the thickness of the metal layer 26, then the rate of attack of the etchant through the pattern 34' should be approximately half of the rate of attack of the etchant on the bare metal 26 not covered by the pattern 34. Obviously, the remaining portion of the metal layer 26 underlying the lead pattern 32 is not attacked by the etchant except for undercutting at the periphery 33.

It is desired in accordance with the present invention that the arrangement of the second portion of the resist pattern 34 or 34' be such that there is sufficient undercutting of the resist pattern 34 or 34' in the region of the step 25 so that the resist pattern 34 or 34' is lifted away adjacent the step 25 during etching.

Figure 12:
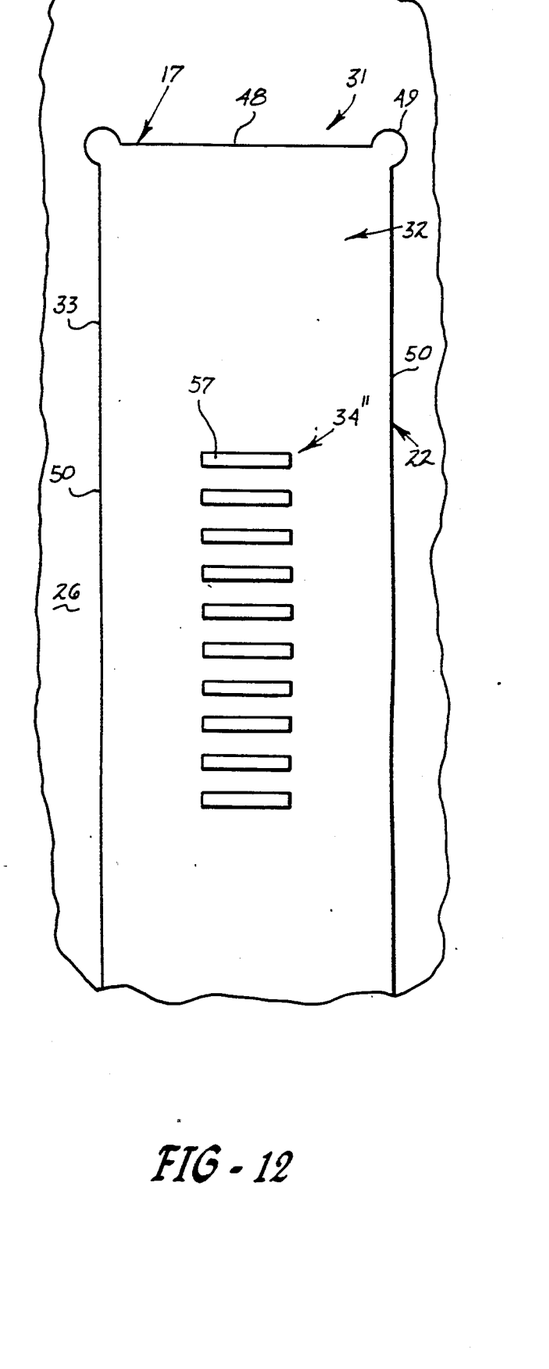
FIG. 12 is a partial top view of an etch resist pattern for forming the leads in accordance with yet another embodiment of this invention.

Referring to FIG. 12, yet another alternative pattern 34" is shown for generating the step 25 in the lead 17. In this pattern, a plurality of slots 57 are arranged so that their longitudinal axes are generally parallel to one another and extend transversely of the axis 39 of the lead 17. The width of these slots 57; the spacing between the slots; and their length from side-to-side of the lead pattern 32 generates the step 25. FIGS. 10, 11 and 12 are schematic and not to scale. FIGS. 11 and 12 are intended to illustrate embodiments of this invention and to indicate that it is not limited to the use of longitudinally extending slots as in the embodiment of FIG. 10. Further, it is believed that numerous other designs could be employed as openings in the lead pattern 32 for defining the second portion 34, 34' or 34" of the pattern 31 to provide a step 25 or 25' after etching.

The patents and publications set forth in this specification are intended to be incorporated by reference herein.

It is apparent that there has been provided in accordance with this invention a process for manufacturing bumped tape for tape automated bonding and the product produced thereby which fully satisfy the objects, means, and advantages set forth hereinbefore. While the invention has been described in combination with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

What is claimed is:

1. A process for step etching a metal tape adapted for use in tape automated bonding comprising:
   providing a metal tape;
   forming an etch resist layer at least over a first face of said metal tape;
   forming at least one pattern of leads in said resist layer over said first face of said metal tape wherein said resist pattern at least defines said leads, said forming step including: forming a first portion of said resist pattern to define said leads, said first portion of said resist pattern being adapted to substantially resist etching of the underlying metal tape; and forming a second portion of said resist pattern within said first portion wherein said pattern is configured to allow etching of the underlying metal tape at a reduced rate as compared to portions of the metal tape not covered by the resist pattern;
   etching said metal tape in the regions not covered by said resist pattern at a desired rate and etching said metal tape underlying said second portion of said resist pattern at a reduced rate as compared to said desired rate so as to form a metal tape having a plurality of leads corresponding to said resist pattern with each of said leads having a step therewithin generated by said second portion of said resist pattern, whereby said leads and said steps form simultaneously.

2. A process as in claim 1 wherein said leads comprise interconnect leads and wherein each of said leads in said pattern of interconnect leads includes an inner lead portion adapted to bond to an electronic device and wherein said second portion of said resist pattern is arranged adjacent said inner lead portion, whereby said inner lead portion after said etching step comprises a bump as compared to said step in said lead.

3. A process as in claim 2 wherein providing of said metal tape comprises providing said metal tape having a second face opposing said first face bonded to a flexible nonmetallic substrate, and wherein said step of forming said resist layer at least over said first face of said metal tape comprises forming said resist layer over at least said first face of said metal tape and any exposed portions of said second face.

4. A process as in claim 3 wherein said flexible nonmetallic substrate has at least one aperture arranged such that when said leads are formed a first portion of each of said leads extends over said aperture in cantilever fashion and a second portion of each of said leads extends over said substrate and remains bonded thereto, whereby when said first portion of said leads is connected to an electronic device it is possible to test or burn in said electronic device by electrical connection to said second portion of said leads.

5. A process as in claim 4 wherein said forming of said at least one pattern of interconnect leads comprises forming a plurality of patterns of interconnect leads with each pattern being spaced apart from each other in a longitudinal sense on said nonmetallic substrate and wherein said flexible nonmetallic substrate includes a plurality of said apertures spaced apart in a longitudinal sense in correspondence with each of said plurality of interconnect lead patterns.

6. A process as in claim 2 wherein said second portion of said resist pattern comprises at least one opening in said resist pattern having desired dimensions configured to allow etching of the underlying metal tape at said reduced rate.

7. A process as in claim 4 wherein said second portion of said resist pattern comprises at least one opening in said resist pattern having desired dimensions configured to allow etching of the underlying metal tape at said reduced rate.

8. A process as in claim 5 wherein said second portion of said resist pattern comprises at least one opening in said resist pattern having desired dimensions configured to allow etching of the underlying metal tape at said reduced rate.

9. A process as in claim 6 wherein said step of forming said second portion of said resist pattern comprises forming a plurality of said openings in said resist pattern.

10. A process as in claim 7 wherein said forming of said second portion of said resist pattern comprises forming a plurality of said openings in said resist pattern.

11. A process as in claim 8 wherein said forming of said second portion of said resist pattern comprises forming a plurality of said openings in said resist pattern.

12. A process as in claim 9 wherein said plurality of openings comprise elongated slots having their long axes arranged longitudinally of said leads, said slots being spaced apart from one another transversely of said leads.

13. A process as in claim 12 comprising two of said slots in each of said leads of said lead pattern, each of of said slots having an opening with a transverse width W, said slots being spaced from an edge of said lead pattern closest thereto by a transverse distance of approximately 2W and each said slots in each lead of said lead pattern being spaced from one another by a transverse distance of approximately 4W.

14. A process as in claim 2 wherein each of said leads in said pattern of interconnect leads includes an outer lead portion adapted to bond to electronic circuitry and wherein additional second portions of said resist pattern are arranged adjacent said outer lead portion, whereby said outer lead portion after said etching step comprises a bump or bumps defined by steps in said lead.

15. A metal tape having at least one interconnect lead pattern defining a plurality of interconnect leads with each of said leads having at least one step therewithin;
   said step defining at least one bump in each of said leads at least at one end of said leads;
   each said step comprising a web portion connecting each said bump to its lead, said web portion having means for stiffening said web portion comprising a channel beam cross section transversely of said lead.

16. A metal tape as in claim 15 wherein said tape is supported by a flexible nonmetallic substrate bonded to said tape.

17. A metal tape as in claim 16 wherein said flexible nonmetallic substrate has at least one aperature arranged such that a first portion of each of said leads extends over said aperature in cantilever fashion and a second portion of each of said leads extends over said substrate and is bonded thereto,
   whereby when said first portion of said leads is connected to an electronic device it is possible to test or burn in said electronic device by electrical connection to said second portion of said leads.

18. A metal tape as in claim 17 wherein said tape includes a plurality of interconnect lead patterns longitudinally spaced apart along said tape and wherein said tape includes a plurality of said aperatures longitudinally spaced apart along said tape with each said aperature being in correspondence with each of said plurality of interconnect lead patterns.

* * * * *